United States Patent
Kong et al.

(10) Patent No.: US 10,186,527 B2
(45) Date of Patent: Jan. 22, 2019

(54) ARRAY SUBSTRATE, METHOD FOR MANUFACTURING THE ARRAY SUBSTRATE, AND DISPLAY DEVICE

(71) Applicant: BOE TECHNOLOGY GROUP CO., LTD., Beijing (CN)

(72) Inventors: Xiangyong Kong, Beijing (CN); Jun Cheng, Beijing (CN); Xiaodi Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/545,817

(22) PCT Filed: Apr. 15, 2016

(86) PCT No.: PCT/CN2016/079451
§ 371 (c)(1),
(2) Date: Jul. 24, 2017

(87) PCT Pub. No.: WO2016/192476
PCT Pub. Date: Dec. 8, 2016

(65) Prior Publication Data
US 2018/0019263 A1 Jan. 18, 2018

(30) Foreign Application Priority Data
Jun. 5, 2015 (CN) .......................... 2015 1 0307054

(51) Int. Cl.
*H01L 21/302* (2006.01)
*H01L 21/461* (2006.01)
(Continued)

(52) U.S. Cl.
CPC ............ *H01L 27/124* (2013.01); *H01L 21/77* (2013.01); *H01L 27/12* (2013.01); *H01L 27/127* (2013.01);
(Continued)

(58) Field of Classification Search
CPC .... H01L 27/1225; H01L 27/124; H01L 29/45
(Continued)

(56) References Cited

U.S. PATENT DOCUMENTS 7,504,661 B2 * 3/2009 Jung .................... H01L 27/1255
257/59

FOREIGN PATENT DOCUMENTS

CN 1892373 A 1/2007
CN 1991449 A 7/2007
(Continued)

OTHER PUBLICATIONS

English translation of PCT (CN) International Search Report, Application No. PCT/CN2016/079451, dated Jul. 20, 2016, 2 pgs.
(Continued)

*Primary Examiner* — David S Blum
(74) *Attorney, Agent, or Firm* — Armstrong Teasdale LLP

(57) ABSTRACT

The embodiments of present disclosure disclose an array substrate, a method for manufacturing the array substrate, and a display device. The method includes forming a pixel electrode layer, a gate metal layer, and a source/drain metal layer on a base substrate, the pixel electrode layer including a first connection part pattern, the gate metal layer including a second connection part pattern, the source/drain metal layer including a third connection part pattern, wherein the first connection part pattern and the second connection part pattern overlap, and a portion of the first connection part pattern extending beyond the second connection part pattern is electrically connected with the third connection part pattern through a first via hole.

20 Claims, 3 Drawing Sheets

(51) Int. Cl.
  *H01L 29/12* (2006.01)
  *H01L 27/12* (2006.01)
  *H01L 21/77* (2017.01)
  *H01L 29/45* (2006.01)
  *H01L 29/49* (2006.01)
  *H01L 29/786* (2006.01)
  *G02F 1/1343* (2006.01)
  *G02F 1/1362* (2006.01)
  *G02F 1/1368* (2006.01)

(52) U.S. Cl.
  CPC ...... *H01L 27/1225* (2013.01); *H01L 27/1288* (2013.01); *H01L 29/45* (2013.01); *H01L 29/4908* (2013.01); *H01L 29/7869* (2013.01); *H01L 29/78618* (2013.01); *G02F 1/1368* (2013.01); *G02F 1/13439* (2013.01); *G02F 1/136286* (2013.01); *G02F 2001/136295* (2013.01); *G02F 2201/123* (2013.01)

(58) Field of Classification Search
  USPC .............................................. 438/706; 257/43
  See application file for complete search history.

(56) References Cited

FOREIGN PATENT DOCUMENTS

| | | |
|---|---|---|
| CN | 101060125 A | 10/2007 |
| CN | 102832253 A | 12/2012 |
| CN | 104992950 A | 10/2015 |
| KR | 2009043213 A | 5/2009 |

OTHER PUBLICATIONS

PCT (CN) Written Opinion, Application No. PCT/CN2016/079451, dated Jul. 20, 2016, 6 pgs. with English translation.
China First Office Action, Application No. 201510307054.7, dated Jul. 3, 2017, 22 pgs.: with English translation.

* cited by examiner

ARRAY SUBSTRATE, METHOD FOR MANUFACTURING THE ARRAY SUBSTRATE, AND DISPLAY DEVICE

CROSS REFERENCE TO RELATED APPLICATIONS

This patent application is a National Stage Entry of PCT/CN2016/079451 filed on Apr. 15, 2016, which claims the benefit and priority of Chinese Patent Application No. 201510307054.7 filed on Jun. 5, 2015, the disclosures of which are incorporated herein by reference in their entirety as a part of the present application.

BACKGROUND

Embodiments of present disclosure relate to an array substrate, a method for manufacturing the array substrate, and a display device.

In recent years, display technologies have been developed rapidly. In a field of display technology represented by liquid crystal displays (LCDs), gate lines and data lines as well as gate electrodes, source electrodes and drain electrodes in thin film transistors (TFTs), which are made of a metal with low-resistance properties, for example, copper (Cu), have already been applied to display devices due to an increase in resolution, an increase in a display size, and a low-resistance wiring required by the integration of driver circuits in the display devices.

However, metals with low-resistance properties such as Cu are active, therefore if conductive connection members such as a gate line and other wirings made of Cu are used, a surface of Cu is liable to be oxidized during an etching process, resulting in poor contact and affecting conductive performance of conductive members.

BRIEF DESCRIPTION

Embodiments of present disclosure provide an array substrate, a method for manufacturing the array substrate, and a display device, avoiding a problem that, due to the use of a material with a low resistance characteristic in a conductive member, surface oxidation of the conductive member affects the conductive performance.

In a first aspect, the present disclosure provides a method for manufacturing an array substrate, including forming a pixel electrode layer, a gate metal layer, and a source/drain metal layer on a base substrate, the pixel electrode layer including a first connection part pattern, the gate metal layer including a second connection part pattern, the source/drain metal layer including a third connection part pattern, wherein the first connection part pattern and the second connection part pattern overlap, and a portion of the first connection part pattern extending beyond the second connection part pattern is electrically connected with the third connection part pattern through a first via hole.

Furthermore, the method further includes forming a conductive buffer layer between the pixel electrode layer and the gate metal layer.

Furthermore, the method further includes forming a photoresist layer on the gate metal layer, forming a fully exposed area, an unexposed area and a grayscale exposed area in the photoresist layer using a grayscale mask plate through an exposure-and-development process so as to remove photoresist of the fully exposed area and partial photoresist of the grayscale exposed area, etching the pixel electrode layer, the conductive buffer layer and the gate metal layer located below the fully exposed area, removing the photoresist of the grayscale exposed area using the grayscale mask plate, etching the conductive buffer layer and the gate metal layer located below the grayscale exposed area to form a pixel electrode pattern and the first connection part pattern, and removing photoresist of the unexposed area to form a gate pattern and the second connection part pattern.

Furthermore, the method further includes forming a gate insulating layer and an etching barrier layer, and forming, at a portion of the gate insulating layer and the etching barrier layer where an electric connection between the first connection part pattern and the third connection part pattern are to be formed, a first via hole for electrically connecting the first connection part pattern and the third connection part pattern.

In a second aspect, the present disclosure further provides an array substrate, including a base substrate, a pixel electrode layer, a gate metal layer, and a source/drain metal layer, the pixel electrode layer including a first connection part pattern, the gate metal layer including a second connection part pattern, and the source/drain metal layer including a third connection part pattern, wherein the first connection part pattern and the second connection part pattern overlap, and a portion of the first connection part pattern extending beyond the second connection part pattern is electrically connected with the third connection part pattern through a first via hole.

Furthermore, the array substrate further includes an etching barrier layer and a gate insulating layer disposed between the pixel electrode layer and the source/drain metal layer, the first via hole penetrating through the etching barrier layer and the gate insulating layer.

Furthermore, the array substrate further includes a conductive buffer layer disposed between the pixel electrode layer and the gate metal layer.

Furthermore, a material of the conductive buffer layer includes molybdenum-niobium alloy or titanium.

Furthermore, a source pattern or a drain pattern disposed in the source/drain metal layer is electrically connected with a pixel electrode pattern disposed in the pixel electrode layer through a second via hole extending through the etching barrier layer and the gate insulating layer.

Furthermore, a material of both the gate metal layer and the source/drain metal layer includes copper.

In a third aspect, the present disclosure further provides a display device, including the array substrate above.

From the technical solutions above, it can be seen that, in the array substrate, the method for manufacturing the array substrate, and the display device provided in the present disclosure, by electrically connecting the third connection part pattern in the source/drain metal layer with the first connection part pattern in the pixel electrode layer, instead of electrically connecting the third connection part pattern in the source/drain metal layer with the second connection part pattern in the gate metal layer, a problem that, due to a material with a low resistance characteristic being used for the second connection part pattern, the surface oxidation of the material with a low resistance characteristic affects the conductive performance, can be efficiently avoided.

BRIEF DESCRIPTION OF THE DRAWINGS

For the sake of illustrating the technical solutions of the embodiments of present disclosure more clearly, a brief introduction to drawings of the embodiments is made as follows. Apparently, the following drawings merely relate to some embodiments of present disclosure, and do not limit present disclosure.

DETAILED DESCRIPTION

Figure 1:
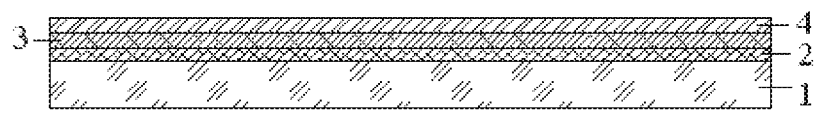
FIGS. 1 to 10 are process schematic diagrams of a method for manufacturing an array substrate provided in an embodiment of present disclosure.

The technical solutions of the embodiments of the present disclosure will be described clearly and thoroughly hereinafter in conjunction with the drawings in respective embodiments in order to make the technical solutions and advantages of the embodiments of the disclosure more clear. Obviously, the embodiments described are only some rather than all of the embodiments of the disclosure. All other embodiments obtained by one ordinary person skilled in the art based on the described embodiments in the disclosure without creative work are within the scope of the present disclosure.

The present disclosure provides a method for manufacturing an array substrate, as shown in FIGS. 1-10, including forming a pixel electrode layer 2, a gate metal layer 4, and a source/drain metal layer 11 on a base substrate 1, the pixel electrode layer 2 including a first connection part pattern 21, the gate metal layer 4 including a second connection part pattern 41, and the source/drain metal layer 11 including a third connection part pattern 111, wherein the first connection part pattern 21 and the second connection part pattern 41 overlap, and a portion of the first connection part pattern 21 extending beyond the second connection part pattern 41 is electrically connected with the third connection part pattern 111 through a first via hole 12.

It is noted that, in an illustrative embodiment of the present disclosure, the second connection part pattern and the third connection part pattern may be a part of a line for transmitting a signal or electric power.

In the method above, by electrically connecting the third connection part pattern 111 in the source/drain metal layer 11 with the first connection part pattern 21 in the pixel electrode layer 2, instead of electrically connecting the third connection part pattern 111 in the source/drain metal layer 11 with the second connection part pattern 41 in the gate metal layer 4, a problem that, due to a material with a low resistance characteristic (for example, Cu) being used for the second connection part pattern 41 and being etched to form a connection via hole therein, the surface oxidation of the material with a low resistance characteristic affects the conductive performance, can be efficiently avoided.

The flow of the method for manufacturing an array substrate above will be described in detail below. The flow of the method for manufacturing an array substrate above may include the following steps S1-S11.

In step S1, a pixel electrode layer 2, a conductive buffer layer 3, and a gate metal layer 4 are formed on a base substrate 1 in sequence, as shown in FIG. 1.

For instance, the base substrate 1 above may be a glass substrate, a quartz substrate, or an organic resin substrate. A material of the pixel electrode layer 2 may include a transparent conductive metal (for example, ITO), with a thickness controlled within a range of 100-2000 nm. The conductive buffer layer 3 may be formed between the pixel electrode layer 2 and the gate metal layer 4, and a material thereof may include a material such as molybdenum-niobium alloy (MoNb) or titanium (Ti) that prevents a material with a low resistance characteristic from being oxidized and diffused, with a thickness controlled within a range of 10-100 nm. A material of the gate metal layer 4 may include a material with a low resistance characteristic and a high activity, for example, copper or a copper alloy, with Cu taken as an example in the present embodiment, with a thickness controlled within a range of 100-600 nm. The thicknesses of the respective film layers may be adaptively adjusted according to actual conditions.

In step S2, a photoresist layer is formed on the gate metal layer 4.

Figure 2:
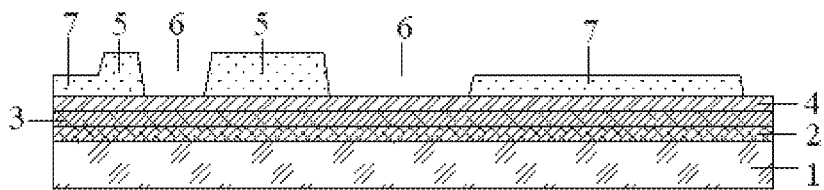

In step S3, a fully exposed area, an unexposed area and a grayscale exposed area are formed in the photoresist layer using a grayscale mask plate through an exposure-and-development process, so that photoresist of the fully exposed area (i.e., an area 6 where the photoresist is fully removed) and partial photoresist of the grayscale exposed area (i.e., an area 7 where the photoresist is semi-remained) are removed, as shown in FIG. 2.

It is appreciated that the grayscale mask plate includes a completely opaque portion, a semi-transparent portion, and a completely transparent portion. For instance, a kind of grayscale mask plate refers to a mask plate in which, on a transparent base material, an opaque light-shielding metal layer is formed in some regions, a semi-transparent light-shielding metal layer is formed in some other regions, and no light-shielding metal layer is formed in other regions, wherein a thickness of the semi-transparent light-shielding metal layer is less than that of the completely opaque light-shielding metal layer. Furthermore, the transmittance of the semi-transparent light-shielding metal layer with respect to ultraviolet light may be changed by the adjustment of the thickness of the semitransparent light-shielding metal layer.

On this basis, the working principle of the grayscale mask plate is, for example, as follows: the intensities of transmitted light in different regions during exposure are different by controlling the thicknesses of the light-shielding metal layer in different regions on the grayscale mask plate, so that after the photoresist is subjected to selective exposure and development, an unexposed area, a grayscale exposed area and a fully exposed area respectively corresponding to the completely opaque portion, the semi-transparent portion and the completely transparent portion of the grayscale mask plate are formed.

The photoresist referred to in the present embodiment is positive photoresist, and it may include a photosensitive liquid mixture of three main components: a photosensitive resin, a sensitizing agent, and a solvent. After the photosensitive resin is exposed to light, a photocuring reaction quickly occurs in the exposed region, and then a specific solution may be used to wash off the cured photosensitive resin.

Figure 3:
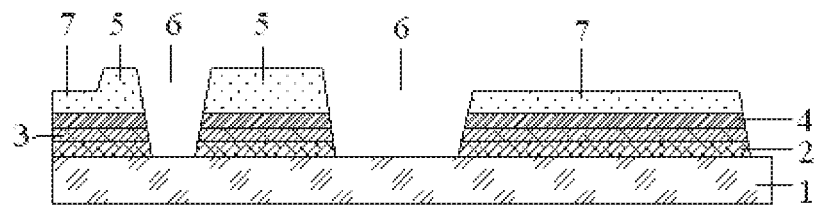

In step S4, the pixel electrode layer 2, the conductive buffer layer 3, and the gate metal layer 4 located below the fully exposed area are etched, as shown in FIG. 3.

The above-described step S4 may be performed by, for example, but not limited to, etching the gate metal layer 4 located below the fully exposed area by a wet etching process using a hydrogen peroxide series etching solution, then etching the conductive buffer layer 3 exposed in the fully exposed area after the gate metal layer 4 is etched away, by a dry etching process using a dry etching gas such as $Cl_2+BCl_3$, etching the pixel electrode layer 2 exposed in the fully exposed area after the conductive buffer layer 3 is etched away, by a wet etching process using an oxalic acid series etching solution, so that the base substrate 1 is exposed from below the fully exposed area.

Figure 4:
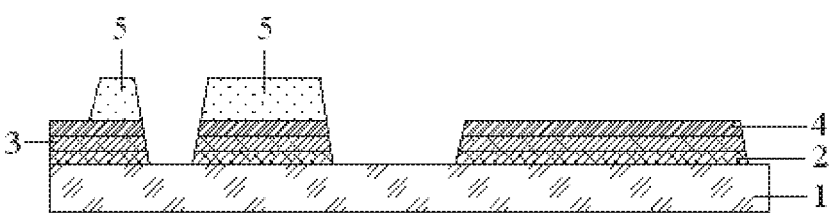

In step S5, the photoresist in the grayscale exposed area is removed using the grayscale mask plate, as shown in FIG. 4.

The working principle thereof is similar to that in step S3, and will not be described in detail.

Figure 5:
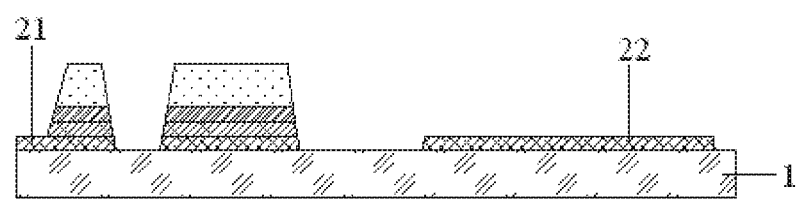

In step S6, the conductive buffer layer 3 and the gate metal layer 4 located below the grayscale exposed area are etched to form the pixel electrode pattern 22 and the first connection part pattern 21, as shown in FIG. 5.

It is appreciated that the method for etching the conductive buffer layer 3 and the gate metal layer 4 located below the grayscale exposed area is similar to that in step S4, and will not be described in detail.

Figure 6:
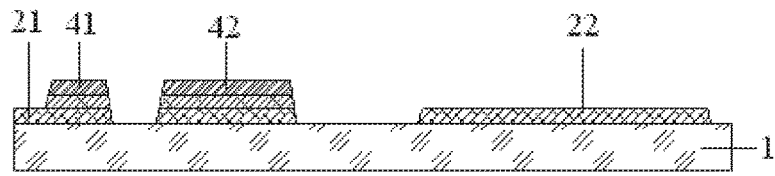

In step S7, the photoresist in the unexposed area (i.e., an area 5 where the photoresist is fully remained) is removed to form a gate pattern 42 and the second connection part pattern 41, as shown in FIG. 6.

The second connection part pattern 41 may be a conductive connection member such as a gate line or other wiring.

In step 5 of steps S3-S7, a same grayscale mask plate as in step S3 is used to remove the photoresist remaining in the grayscale exposed area, so that the pixel electrode pattern 22, the first connection part pattern 21, the gate pattern 42, and the second connection part pattern 41 are formed by using only one mask process, reducing the number of use of the mask process.

Figure 7:
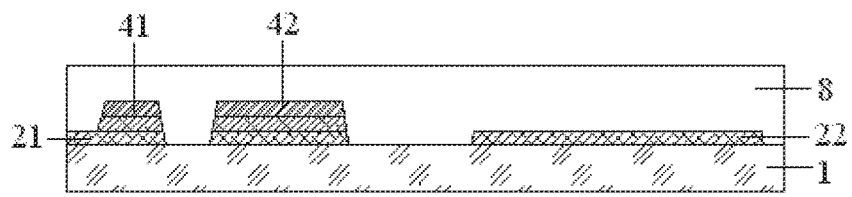

In step S8, a gate insulating layer 8 is formed, as shown in FIG. 7.

Figure 8:
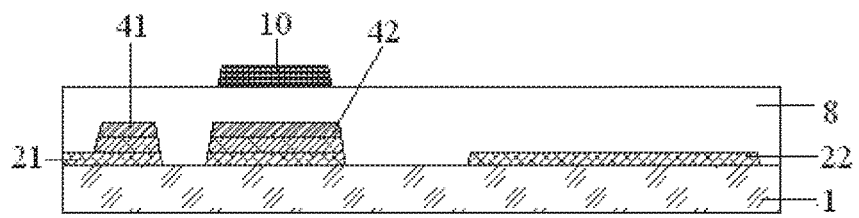

In step S9, an active layer is formed on the gate insulating layer 8, and an active layer pattern 10 is formed by using one mask process, as shown in FIG. 8.

A material of the active layer may include at least one of transparent metal oxide semiconductor materials such as Indium Gallium Zinc Oxide (IGZO), Indium Tin Zinc Oxide (ITZO), Indium Oxide ($In_2O_3$), and Zinc Oxide (ZnO), with a thickness controlled within a range of 10-150 nm.

Figure 9:
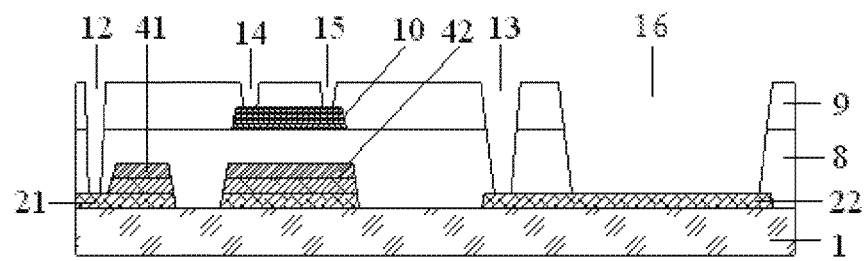

In step S10, an etching barrier layer 9 is formed, a first via hole 12, a second via hole 13, a third via hole 14, and a fourth via hole 15 are formed by using one mask process, and a pixel electrode pattern exposing area 16 may be formed, as shown in FIG. 9.

Figure 10:
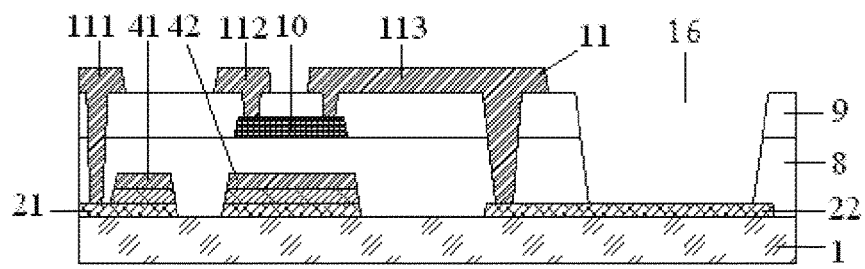

In step S11, a source/drain metal layer 11 is formed, and a third connection part pattern 111, a source pattern 112, and a drain pattern 113 are formed by using one mask process, as shown in FIG. 10.

It is noted that, if the pixel electrode pattern exposing area 16 is formed as required in step S10, it is required to etch away the source/drain metal layer deposited in the pixel electrode pattern exposing area 16 after the third connection part pattern 111, the source pattern 112, and the drain pattern 113 are formed in step S11 so as to expose the pixel electrode pattern 22 below the pixel electrode pattern exposing area 16.

The source/drain metal layer 11 may be a single layer or a multi-layer composite stack formed of one or more materials selected from Mo, MoNb, Al, AlNd, Ti, and Cu. In an exemplary embodiment, it is a single layer or a multi-layer composite film formed of Mo, Al or an alloy containing Mo and Al.

In above steps S9-S11, different patterns of respective layers or via holes are formed respectively by using one mask process. The "mask process" here may be understood as a patterning process, which may include a photolithographic process, or a photolithographic process and an etching step, and may include other processes for forming a predetermined pattern such as printing or ink-jetting. The photolithographic process means a process for forming a pattern using photoresist, mask plate and exposure machine, etc., and including film-forming, exposure, development and other procedures. It is to be understood that in the steps of the method for manufacturing an array substrate above, only four mask processes are required. Therefore, in the method above, by electrically connecting the third connection part pattern 111 in the source/drain metal layer 11 with the first connection part pattern 21 in the pixel electrode layer 2, instead of electrically connecting the third connection part pattern 111 in the source/drain metal layer 11 with the second connection part pattern 41 in the gate metal layer 4, a problem that, due to a material with a low resistance characteristic (for example, Cu or Cu alloy) being used for the second connection part pattern 41 and being etched to form a connection via hole therein, the surface oxidation of the material with a low resistance characteristic affects the conductive performance, can be efficiently avoided. In addition, in the process of forming the first connection part in the method above, only one mask process is used to form the pixel electrode pattern 22, the first connection part pattern 21, the gate pattern 42 and the second connection part pattern 41, thereby reducing number of use of mask process and saving costs.

A portion of the first via hole 12, where an electric connection between the first connection part pattern 21 and the third connection part pattern 111 is to be formed in the gate insulating layer 8 and etching barrier layer 9, is mainly used for electrically connecting the first connection part pattern 21 with the third connection part pattern 111, a portion of the second via hole 13, where an electric connection between the pixel electrode pattern 22 and the source pattern 112 or the drain pattern 113 is to be formed in the gate insulating layer 8 and etching barrier layer 9, is mainly used for electrically connecting the pixel electrode pattern 22 with the source pattern 112 or the drain pattern 113, portions of the third via hole 14 and the fourth via hole 15, where electric connections between the source pattern 112, the drain pattern 113, and the active layer pattern 10 are to be formed in the etching barrier layer 9, are mainly used for electrically connecting the source pattern 112, the drain pattern 113 with the active layer pattern 10. Positions of the source pattern 112 and the drain pattern 113 are interchangeable, and the present embodiment will not define which pattern is the source pattern and which pattern is the drain pattern, they can be concretely determined based on the flow direction of current in the circuit.

It is to be understood that in above process for manufacturing the array substrate, respective layers such as the pixel electrode layer 2, the conductive buffer layer 3, the gate metal layer 4, the gate insulating layer 8, and the etching barrier layer 9 may be formed by vacuum deposition or magnetron sputtering etc., which will not be described in detail in the present embodiment.

In addition, it shall be noted that the pixel electrode layer 2 may be understood as a layer including the pixel electrode pattern 22 or used for forming the pixel electrode pattern 22, the gate metal layer 4 may be understood as a layer including the gate pattern 42 or used for forming the gate pattern 42, and the source/drain metal layer 11 may be understood as a layer including the source pattern 112 and the drain pattern 113 or used for forming the source pattern 112 and the drain pattern 113.

The present embodiment further provides an array substrate, as shown in FIG. 10, including a base substrate 1, a pixel electrode layer 2, a gate metal layer 4, and a source/ drain metal layer 11, the pixel electrode layer 2 including a first connection part pattern 21, the gate metal layer 4 including a second connection part pattern 41, and the source/drain metal layer 11 including a third connection part pattern 111, wherein the first connection part pattern 21 and the second connection part pattern 41 overlap, and a portion of the first connection part pattern 21 extending beyond the second connection part pattern 41 is electrically connected with the third connection part pattern 111 through a first via hole 12.

A material of the gate metal layer 4 and the source/drain metal layer 11 above includes an active material with a low resistance characteristic and high activity, for example, copper or a copper alloy, with Cu taken as an example in the present embodiment.

In the array substrate above, by electrically connecting the third connection part pattern 111 in the source/drain metal layer 11 with the first connection part pattern 21 in the pixel electrode layer 2, instead of electrically connecting the third connection part pattern 111 in the source/drain metal layer 11 with the second connection part pattern 41 in the gate metal layer 4, a problem that, due to a material with a low resistance characteristic (for example, Cu) being used for the second connection part pattern 41 and being etched to form a connection via hole therein, the surface oxidation of the material with a low resistance characteristic affects the conductive performance, can be efficiently avoided.

The array substrate may further include an etching barrier layer 9 and a gate insulating layer 8 disposed between the pixel electrode layer 2 and the source/drain metal layer 11, the first via hole 12 penetrating through the etching barrier layer 9 and the gate insulating layer 8, and a source pattern 112 or a drain pattern 113 disposed in the source/drain metal layer 11 is electrically connected with the pixel electrode pattern 22 disposed in the pixel electrode pattern 2 through a second via hole 13 penetrating through the etching barrier layer 9 and the gate insulating layer 8.

In order to prevent the material with a low resistance characteristic (for example, Cu) of the gate metal layer 4 from being oxidized in the etching process, the array substrate further includes a conductive buffer layer 3 disposed between the pixel electrode layer 2 and the gate metal layer 3, wherein a material of the conductive buffer layer 3 includes a material such as a molybdenum-niobium alloy or titanium for preventing the material with a low resistance characteristic (for example, Cu) from being oxidized or diffused.

Figure 11:
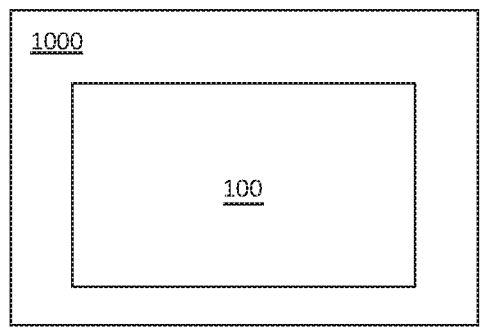
FIG. 11 is a schematic diagram of a display device including the array substrate provided in an embodiment of the present disclosure.

As shown in FIG. 11, the present embodiment further provides a display device 1000, including the array substrate above, which is indicated by a reference number 100.

The display device 1000 in the present embodiment may include any product or component having a display function such as a mobile phone, a tablet computer, a television set, a laptop computer, a digital photo frame, a navigator, or the like.

A large number of specific details have been described in the specification. However, it will be understood that the embodiments of present disclosure may be implemented without these specific details. In some examples, well-known methods, structures, and techniques are not shown in detail so as not to obscure the understanding of this specification.

The technical terms or scientific terms used in this disclosure should be the same meanings as commonly understood by those of ordinary skill in the art to which the present disclosure belongs. The terms "first", "second" and the like used in this disclosure are not intended to indicate any sequence, amount or importance, but are merely used to distinguish between different components. Similarly, the words such as "a", "an" or "the" etc., are not intended to limit the amount, but indicate the existence of at least one. The terms "comprise," "comprising", "include", "including", etc., are intended to specify that the components or the objects stated before these terms encompass the components or the objects and equivalents thereof listed after these terms, but do not preclude the other components or objects. The phrases "connect", "connecting", "connected", etc., are not intended to define a physical connection or a mechanical connection, but may include an electrical connection, directly or indirectly. The word "upper", "lower", "left", "right" and the like are merely used to indicate relative position relationship, and when the position of the object which is described is changed, the relative position relationship may be changed accordingly.

The foregoing is merely illustrative embodiments of the present disclosure, and is not intended to limit the scope of the present disclosure. The scope of the present disclosure is defined by the appended claims.

What is claimed is:

1. A method for manufacturing an array substrate, the method comprising: forming a pixel electrode layer, a gate metal layer, and a source/drain metal layer on a base substrate, the pixel electrode layer including a first connection part pattern, the gate metal layer including a second connection part pattern, and the source/drain metal layer including a third connection part pattern, wherein the first connection part pattern and the second connection part pattern overlap, and wherein a portion of the first connection part pattern extending beyond the second connection part pattern is electrically connected with the third connection part pattern through a first via hole.

2. The method according to claim 1, wherein the method further comprises forming a conductive buffer layer between the pixel electrode layer and the gate metal layer.

3. The method according to claim 2, wherein the method further comprises:
   forming a photoresist layer on the gate metal layer;
   forming a fully exposed area, an unexposed area, and a grayscale exposed area in the photoresist layer using a grayscale mask plate through an exposure-and-development process to remove photoresist of the fully exposed area and partial photoresist of the grayscale exposed area;
   etching the pixel electrode layer, the conductive buffer layer, and the gate metal layer located below the fully exposed area;
   removing the photoresist of the grayscale exposed area using the grayscale mask plate;
   etching the conductive buffer layer and the gate metal layer located below the grayscale exposed area to form a pixel electrode pattern and the first connection part pattern; and
   removing the photoresist of the unexposed area to form a gate pattern and the second connection part pattern.

4. The method according to claim 2, wherein a material of the conductive buffer layer includes one of a molybdenum-niobium alloy and titanium.

5. The method according to claim 1, wherein a material of both the gate metal layer and the source/drain metal layer includes copper.

6. The method according to claim 1, wherein the method further comprises:
   forming a gate insulating layer and an etching barrier layer; and forming, at a portion of the gate insulating layer and the etching barrier layer where an electric connection between the first connection part pattern and the third connection part pattern are to be formed, a first via hole for electrically connecting the first connection part pattern with the third connection part pattern.

7. The method according to claim 6, wherein one of a source pattern and a drain pattern disposed in the source/drain metal layer is electrically connected with a pixel electrode pattern disposed in the pixel electrode layer through a second via hole penetrating through the etching barrier layer and the gate insulating layer.

8. An array substrate comprising: a base substrate, a pixel electrode layer, a gate metal layer and a source/drain metal layer, the pixel electrode layer including a first connection part pattern, the gate metal layer including a second connection part pattern, and the source/drain metal layer including a third connection part pattern, wherein the first connection part pattern and the second connection part pattern overlap, and wherein a portion of the first connection part pattern extending beyond the second connection part pattern is electrically connected with the third connection part pattern through a first via hole.

9. The array substrate according to claim 8, wherein the array substrate further comprises an etching barrier layer and a gate insulating layer disposed between the pixel electrode layer and the source/drain metal layer, the first via hole penetrating through the etching barrier layer and the gate insulating layer.

10. The array substrate according to claim 8, wherein the array substrate further comprises a conductive buffer layer disposed between the pixel electrode layer and the gate metal layer.

11. The array substrate according to claim 10, wherein a material of the conductive buffer layer includes one of a molybdenum-niobium alloy and titanium.

12. The array substrate according to claim 9, wherein one of a source pattern and a drain pattern disposed in the source/drain metal layer is electrically connected with a pixel electrode pattern disposed in the pixel electrode layer through a second via hole penetrating through the etching barrier layer and the gate insulating layer.

13. The array substrate according to claim 8, wherein a material of both the gate metal layer and the source/drain metal layer includes copper.

14. A display device comprising the array substrate according to claim 8.

15. The method according to claim 3, wherein a material of the conductive buffer layer includes one of a molybdenum-niobium alloy and titanium.

16. The array substrate according to claim 9, wherein the array substrate further comprises a conductive buffer layer disposed between the pixel electrode layer and the gate metal layer.

17. A display device comprising the array substrate according to claim 9.

18. A display device comprising the array substrate according to claim 10.

19. A display device comprising the array substrate according to claim 11.

20. A display device comprising the array substrate according to claim 12.

* * * * *

UNITED STATES PATENT AND TRADEMARK OFFICE
CERTIFICATE OF CORRECTION

PATENT NO. : 10,186,527 B2  
APPLICATION NO. : 15/545817  
DATED : January 22, 2019  
INVENTOR(S) : Xiangyong Kong et al.

Page 1 of 1

It is certified that error appears in the above-identified patent and that said Letters Patent is hereby corrected as shown below:

In the Claims

In Claim 9, Column 9, Line 24, delete "etching harrier layer" and insert therefor -- etching barrier layer --.

Signed and Sealed this
Sixth Day of August, 2019

Andrei Iancu
*Director of the United States Patent and Trademark Office*